United States Patent
Chen et al.

(10) Patent No.: US 8,207,001 B2
(45) Date of Patent: Jun. 26, 2012

(54) MANUFACTURING METHOD FOR AN AXIALLY SYMMETRIC LIGHT-EMITTING DIODE ASSEMBLY

(75) Inventors: Ming-Hung Chen, Zhudong Town (TW); Jing-Yi Chen, Zhudong Town (TW)

(73) Assignee: Helio OptoElectronic Corp., Hsinchu County (TW)

( * ) Notice: Subject to any disclaimer, the term of this patent is extended or adjusted under 35 U.S.C. 154(b) by 0 days.

(21) Appl. No.: 13/054,272

(22) PCT Filed: Sep. 23, 2008

(86) PCT No.: PCT/CN2008/001640
§ 371 (c)(1),
(2), (4) Date: Jan. 14, 2011

(87) PCT Pub. No.: WO2010/034132
PCT Pub. Date: Apr. 1, 2010

(65) Prior Publication Data
US 2011/0165715 A1   Jul. 7, 2011

(51) Int. Cl.
*H01L 33/00* (2010.01)

(52) U.S. Cl. ............ 438/28; 257/93; 257/E33.006; 313/500

(58) Field of Classification Search .......... 438/28, 438/26; 313/500; 257/88, 93, E25.02, E33.001, 257/E33.005, E33.006, E33.056, E33.057
See application file for complete search history.

(56) References Cited

U.S. PATENT DOCUMENTS

| | | | |
|---|---|---|---|
| 6,642,666 B1* | 11/2003 | St-Germain | 315/185 S |
| 6,869,812 B1 | 3/2005 | Liu | |
| 2001/0018227 A1* | 8/2001 | Lell | 438/77 |
| 2005/0243552 A1* | 11/2005 | Maxik | 362/249 |
| 2008/0179618 A1 | 7/2008 | Cheng | |
| 2009/0008654 A1 | 1/2009 | Nagai | |

FOREIGN PATENT DOCUMENTS

| | | |
|---|---|---|
| CN | 1790753 | 6/2006 |
| JP | 11111035 | 4/1999 |
| JP | 2005159262 | 6/2005 |
| WO | WO 2006/068297 | 6/2006 |

OTHER PUBLICATIONS

International Search Report for PCT/CN2008/001640 dated Jun. 4, 2009.

* cited by examiner

*Primary Examiner* — Julio J Maldonado
*Assistant Examiner* — Daniel Shook
(74) *Attorney, Agent, or Firm* — Stites & Harbison, PLLC; Juan Carlos A. Marquez, Esq.

(57) ABSTRACT

A manufacturing method for an axially symmetric light-emitting diode assembly disclosed herein includes steps of: providing a substrate; and forming a plurality of light-emitting areas on the substrate. The substrate has a central axis. The light-emitting areas are arranged with axial symmetry around the central axis while being insulated from each other. Each of the light-emitting areas has at least one light-emitting diode, and the light-emitting diodes are electrically connected to each other. Since the light-emitting areas are formed on the substrate with the axially symmetric arrangement, the axially symmetric light-emitting diode assembly can present a well symmetric light pattern.

4 Claims, 6 Drawing Sheets

MANUFACTURING METHOD FOR AN AXIALLY SYMMETRIC LIGHT-EMITTING DIODE ASSEMBLY

CROSS-REFERENCE TO RELATED APPLICATIONS

This application is a 35 USC 371 application of PCT/CN2008/001640 filed on Sep. 23, 2008, published as Pub. No. WO2010/034132. The content of the specification is incorporated herein by reference.

BACKGROUND OF THE INVENTION

1. Technical Field

The present invention relates to manufacturing methods for axially symmetric light-emitting diodes, and more particularly, to a manufacturing method for an axially symmetric light-emitting diode assembly useful to improve the light patterns of LED lamps having multiple light-emitting areas.

2. Description of Related Art

The current trend in LED (light-emitting diode) development goes toward high power light-emitting diodes, which have enhanced overall luminance by packaging plural light-emitting diodes with one substrate. In the packaging process, since the light-emitting diodes are separated by miner intervals, silver paste or solder applied to fix the light-emitting diode on the substrate tends to overflow and cause short circuit among the light-emitting diode. Thus, one known solution is to form multiple light-emitting areas on a single light-emitting diode chip, so as to eliminate problems related to overflowed silver paste or solder while providing improved light extraction efficiency.

For example, U.S. Pat. No. 6,869,812 B1 titled "High power AlInGaN based multi-chip light emitting diode" has disclosed a method for fabricating a light-emitting diode chip, which comprises steps of: providing a transparent substrate; forming at least one active area on the substrate; and cutting the substrate to form at least one light-emitting diode chip with an active area.

The aforementioned prior-art technology improves the overall light extraction efficiency by forming plural active areas with elongated geometry on a transparent substrate, wherein each of the active areas is provided with light-emitting diodes. However, the LED chip of U.S. Pat. No. 6,869,812 B1 has its light pattern restricted by the elongated shape of the active areas and thus suffers from uneven light distribution and asymmetric light pattern.

The problems brought by the elongated geometry of the active areas to the light-emitting diode chip also include limiting the optimal usage of the substrate space. In addition, active areas of such elongated or similar geometry when arranged on the substrate are asymmetric, thus failing to provide a symmetric light pattern.

SUMMARY OF THE INVENTION

One objective of the present invention is to overcome defects existing in the known manufacturing methods for light-emitting diodes by providing a novel manufacturing method for an axially symmetric light-emitting diode assembly. The technical issue to be addressed is to make a plurality of light-emitting areas arranged in an axially symmetric manner, so as to ensure the light-emitting areas with a symmetric light pattern in which light is gathered up but not dispersed, thereby improving light extraction efficiency.

Another objective of the present invention is to provide a novel manufacturing method for an axially symmetric light-emitting diode assembly wherein the technical issue to be addressed is to use axially symmetric arrangement to form as many light-emitting areas as possible, thereby maximizing the use of the space of the substrate.

To achieve the objectives and to address the technical issues of the present invention, the following technical scheme is adopted. According to the present invention, a manufacturing method for an axially symmetric light-emitting diode assembly comprises steps of: providing a substrate, which has a central axis; and forming a plurality of light-emitting areas on the substrate, wherein the light-emitting areas are arranged around and centered at the central axis symmetrically and insulated from each other. Each of the light-emitting areas has at least one light-emitting diode, and the light-emitting diodes are electrically connected to each other.

To further achieve the objectives and to further address the technical issues of the present invention, the following technical measures may be implemented.

In the foregoing manufacturing method for an axially symmetric light-emitting diode assembly, the light-emitting areas are a plurality of round light-emitting areas.

In the foregoing manufacturing method for an axially symmetric light-emitting diode assembly, the light-emitting area is further divided into a plurality of equal-area, equidistant sub light-emitting areas, and the sub light-emitting areas have the same number of light-emitting diodes.

In the foregoing manufacturing method for an axially symmetric light-emitting diode assembly, the sub light-emitting areas are a plurality of non-rectangular sub light-emitting areas.

As compared with prior art, the present invention has obvious benefits and profitable effects. With the above technical schemes, the manufacturing method for an axially symmetric light-emitting diode assembly of the present invention at least has the following benefits and profitable effects:

1. In virtue of the axially symmetric arrangement, the present invention allows a light-emitting diode assembly having multiple light-emitting areas to present a symmetric, non-dispersed light pattern.

2. In virtue of the symmetric, non-dispersed light pattern of the light-emitting diode assembly, the present invention promises improved light extraction efficiency.

To sum up, the present invention is directed to a manufacturing method for an axially symmetric light-emitting diode assembly that comprises steps of: providing a substrate; and forming a plurality of light-emitting areas. The substrate has a central axis at which the light-emitting areas are centered, and furthermore formed with axial symmetry while being insulated from each other. Each of the light-emitting areas has at least one light-emitting diode, and all the light-emitting diodes are electrically connected. Since the light-emitting areas are formed on the substrate with the axially symmetric geometry, the axially symmetric light-emitting diode assembly is endowed with well symmetric light extraction pattern. The present invention possessing the above-recited advantageous and practical merits has made significant improvement in both process and function, so as to provide obvious progress to the related technology and produce useful and practical effects. The present invention, as compared with the known LED manufacturing methods, has enhanced, outstanding effects, thus being more practical and being exactly a novel, progressive and practical approach.

BRIEF DESCRIPTION OF THE DRAWINGS

The invention as well as a preferred mode of use, further objectives and advantages thereof will be best understood by reference to the following detailed description of illustrative embodiments when read in conjunction with the accompanying drawings, wherein.

DETAILED DESCRIPTION OF THE INVENTION

In order to further illustrate the technical means and effects the present invention adopts for achieving the foregoing objectives, with combination of the accompanying drawings and some preferred embodiments, the specific implementing means, manufacturing method, steps, features as well as the effects of the manufacturing method for an axially symmetric light-emitting diode assembly proposed by the present invention will be described in detail below.

Figure 1:
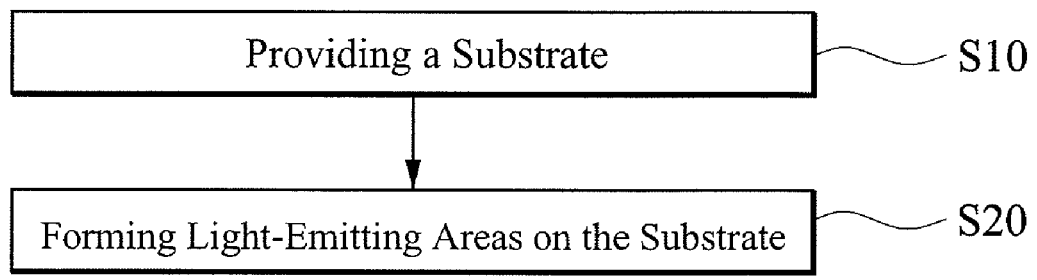
FIG. 1 is a flowchart of a manufacturing method for an axially symmetric light-emitting diode assembly according to one preferred embodiment of the present invention.

As shown in FIG. 1, a manufacturing method for an axially symmetric light-emitting diode assembly 10 according to a preferred embodiment of the present invention comprises steps of: providing a substrate S10; and forming a plurality of light-emitting areas on the substrate S20.

Figure 2:
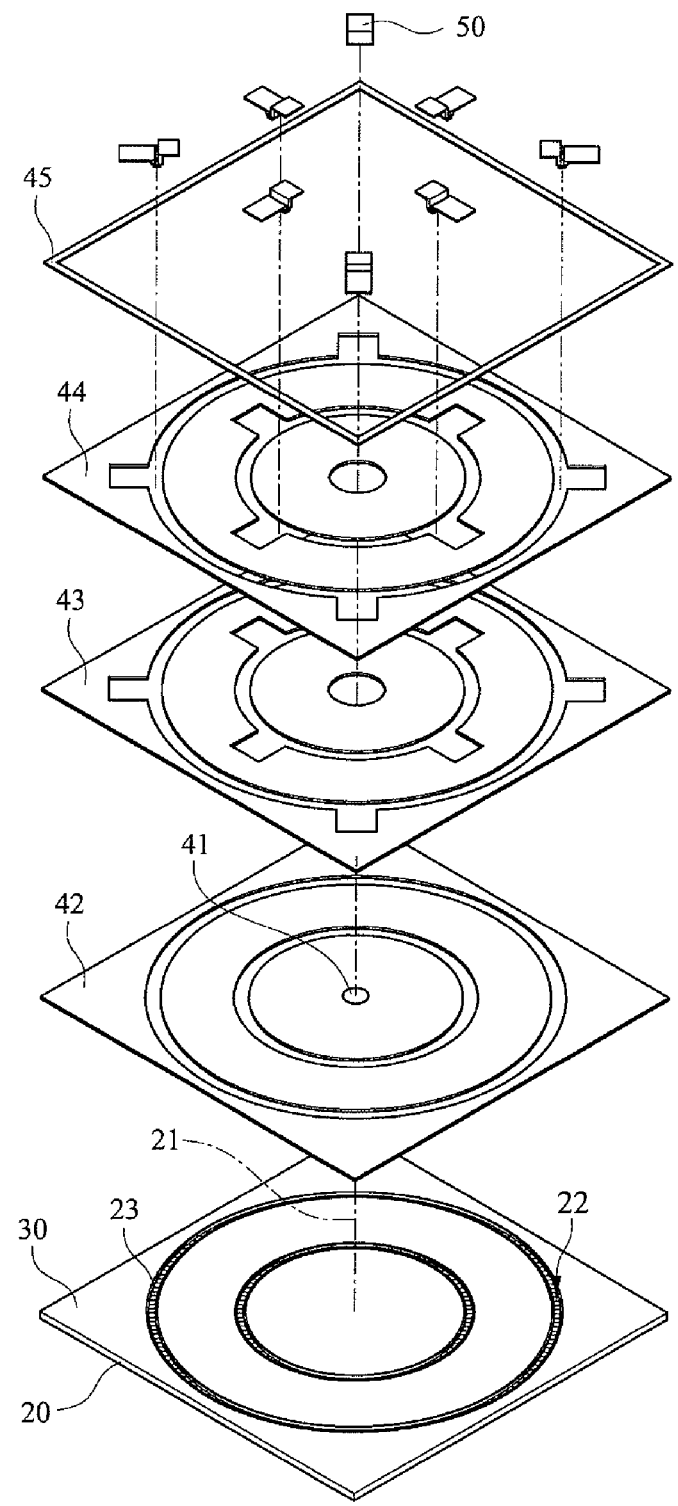
FIG. 2 is an exploded view of the axially symmetric light-emitting diode assembly according to one embodiment of the present invention.
Figure 3:
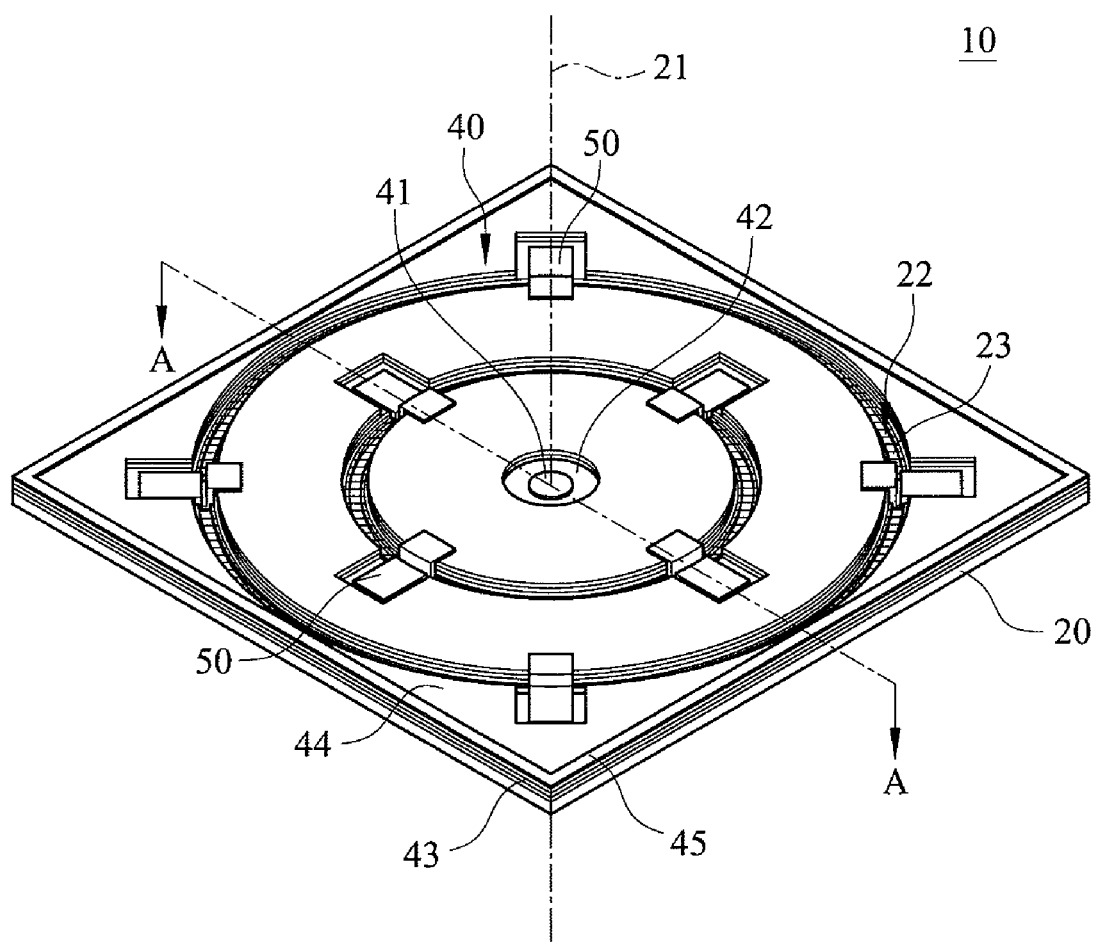
FIG. 3 is an assembled view of FIG. 2.

In the step of providing the substrate S10, referring to FIG. 2 and FIG. 3, the substrate 20 has a central axis 21. The substrate 20 may be made of sapphire, GaN, AlN, or the like.

In the step of forming the light-emitting areas S20, referring to FIG. 2, a plurality of light-emitting areas 30 are centered at the central axis 21 of the substrate 20, and arranged on the substrate 20 with an axially symmetric geometry, such as a plurality of round light-emitting areas 30 centered at the central axis 21 of the substrate 20 and arranged concentrically. Also shown in FIG. 2, the substrate 20 may be provided with a plurality of trenches 22 through an etching process by which the plural round light-emitting areas 30 are defined. In addition, each of the trenches 22 is capped by an insulation layer 23 so that the light-emitting areas 30 are insulated from each other.

As shown in FIG. 3, each of the light-emitting areas 30 on the substrate 20 has at least one light-emitting diode 40, and the light-emitting diode 40 may be composed of an n-type electrode 41, an n-type semiconductor layer 42, an active layer 43, a p-type semiconductor layer 44, and a p-type electrode 45. The p-type electrode 45 may be a transparent electrode that helps increasing light extraction area.

Figure 4:
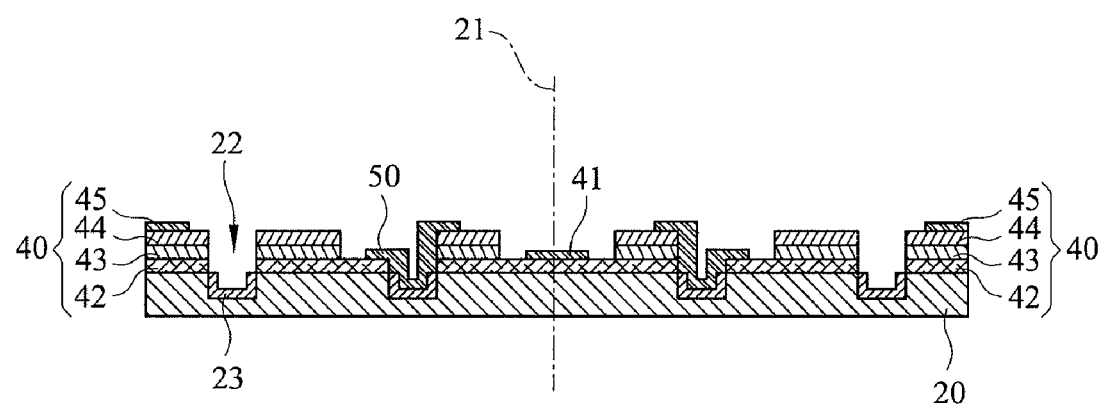
FIG. 4 is a cross-sectional drawing taken along Line A-A of FIG. 3.

Referring to FIG. 4, the light-emitting areas 30 on the substrate 20 may have the light-emitting diodes 40 electrically connected in series or parallel by means of a conductive material 50, such as metal with high electrical conductivity, so the axially symmetric light-emitting diode assembly 10 is enabled to endure high-voltage or high-current loads.

Figure 5:
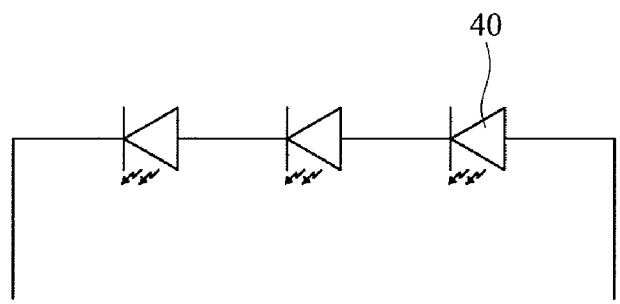
FIG. 5 is an equivalent-circuit diagram of FIG. 2.

When the conductive material 50 is used to make the light-emitting diodes 40 in the light-emitting areas 30 form a serial circuit structure, the equivalent-circuit diagram thereof is as shown in FIG. 5. Thus, the axially symmetric light-emitting diode assembly 10 has its maximum working voltage being three times as much as that of a single light-emitting diode so can be more extensively applied to our daily life.

In addition, the axially symmetric arrangement makes all the light-emitting diodes 40 in the light-emitting areas 30 on the substrate 20 emit light symmetrically with respect to the central axis 21 of the substrate 20 as their common light-emitting axis, so the axially symmetric light-emitting diode assembly 10 can present a good light pattern that is symmetric and non-dispersed. Moreover, the axially symmetric arrangement makes the limited space of the substrate 20 accommodate the maximum number of light-emitting areas 30, so as to dispose the maximum number of light-emitting diodes 40, thereby further improving the overall illumination of the axially symmetric light-emitting diode assembly 10.

Figure 6:
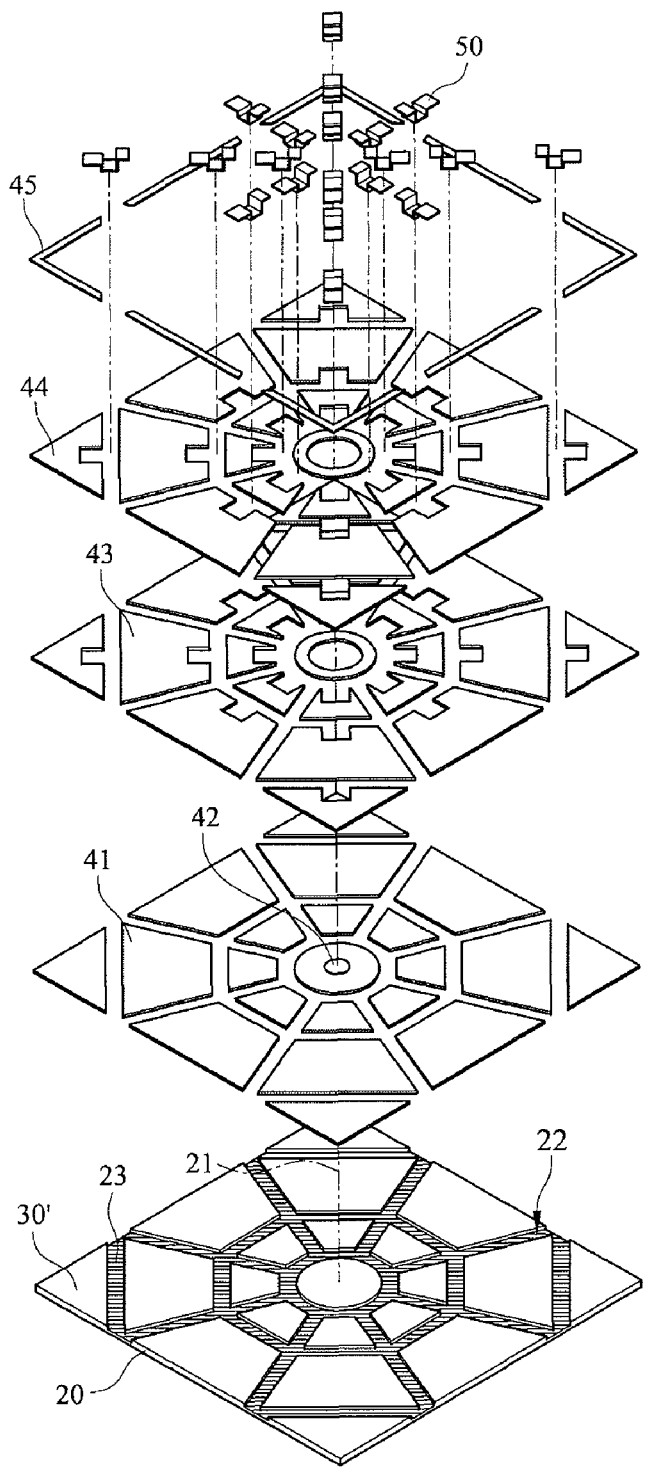
FIG. 6 is an exploded view of the axially symmetric light-emitting diode assembly according to another embodiment of the present invention.

As shown in FIG. 6, each of the light-emitting areas 30 on the substrate 20 may be further divided into a plurality of equal-area, equidistant, non-rectangular sub light-emitting areas 30' by etching the substrate 20, such as a plurality of trapezoid sub light-emitting areas 30', wherein all the sub light-emitting areas 30' are insulated from each other and have the same number of light-emitting diodes 40.

Furthermore, each said light-emitting diode 40 in the sub light-emitting areas 30' may be also composed of an n-type electrode 41, an n-type semiconductor layer 42, an active layer 43, a p-type semiconductor layer 44, and a p-type electrode 45. The p-type electrode 45 may be a transparent electrode that helps increasing light extraction area.

Figure 7:
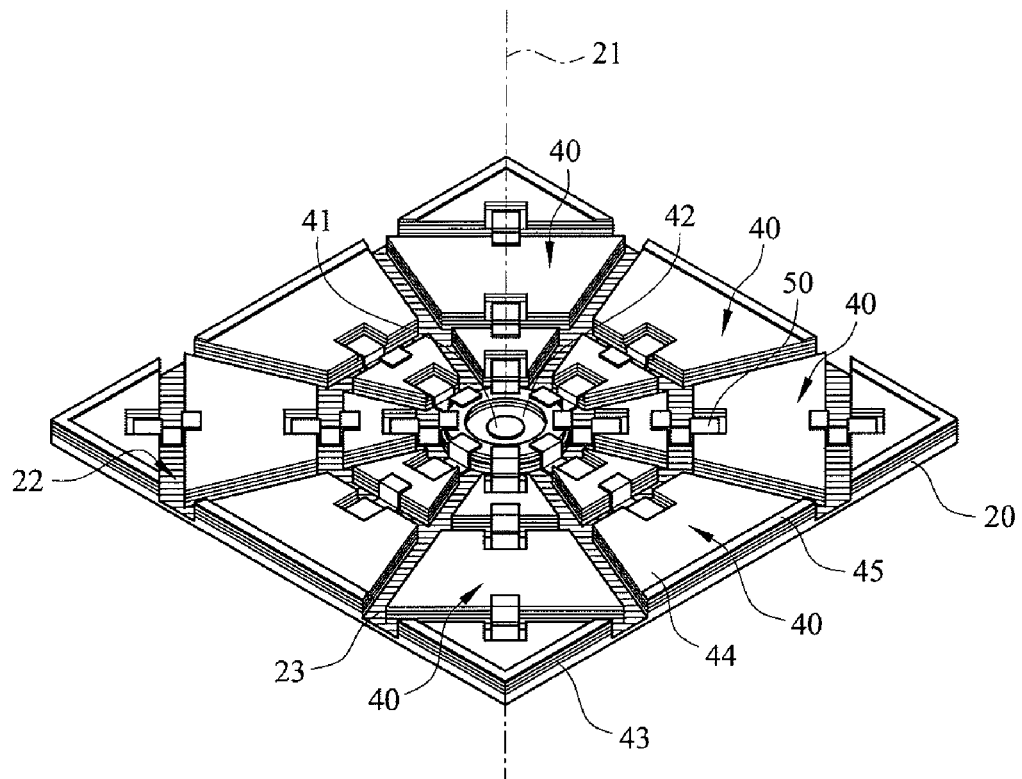
FIG. 7 is an assembled view of FIG. 6.
Figure 8:
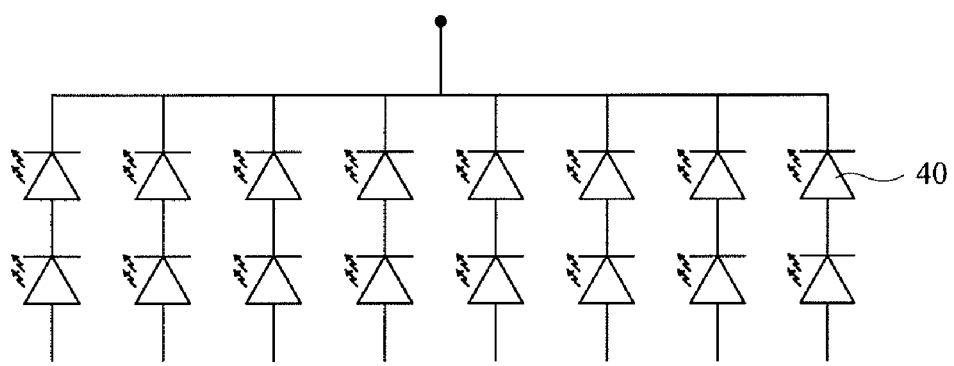
FIG. 8 is an equivalent-circuit diagram of FIG. 7.

As shown in FIG. 7, the light-emitting diodes 40 in the sub light-emitting areas 30' may be electrically connected to each other by means of a conductive material 50, so as to form a series-parallel circuit as depicted in FIG. 8. When the light-emitting diodes 40 in the sub light-emitting areas 30' are connected in series/parallel, the axially symmetric light-emitting diode assembly 10 is enabled to endure inputs of higher voltage and higher current, thus having more extensive application scopes.

The sub light-emitting areas 30' are equidistant to the adjacent ones and centered at the central axis 21 of the substrate 20, while all the sub light-emitting areas 30' have the same area. Therefore, when the light-emitting diodes 40 in the light-emitting areas 30 and sub light-emitting areas 30' on the substrate 20 emit light, the axially symmetric light-emitting diode assembly 10 can present a good light pattern that is symmetric and non-dispersed, thereby further improving the illumination.

The present invention has been described with reference to the preferred embodiments and it is understood that the embodiments are not intended to limit the scope of the present invention. Moreover, as the contents disclosed herein should be readily understood and can be implemented by a person skilled in the art, all equivalent changes or modifications which do not depart from the concept of the present invention should be encompassed by the appended claims.

What is claimed is:

1. A manufacturing method for an axially symmetric light-emitting diode assembly, the method comprising steps of:

providing a substrate, which has an central axis; and forming a plurality of light-emitting areas on the substrate, wherein the light-emitting areas are arranged with axial symmetry around the central axis and insulated from each other, each said light-emitting area having one light-emitting diode and having dimensions the same as the corresponding light-emitting diode, and a plurality of the light-emitting diodes being electrically connected to each other;

wherein the substrate is provided with a plurality of trenches through an etching process by which the plurality of said light-emitting areas is defined and each of the trenches is capped by an insulation layer to insulate two said adjacent light-emitting areas.

2. The manufacturing method of claim 1, wherein the light-emitting areas are a plurality of round light-emitting areas.

3. The manufacturing method of claim 1, wherein each of the light-emitting areas is further divided into a plurality of equal-area, equidistant sub light-emitting areas, the light-emitting diode of the corresponding light-emitting area is divided, wherein the dimensions of each said divided light-emitting diode is the same as the dimensions of each said sub light-emitting area and the sub light-emitting areas have a same number of the light-emitting diodes.

4. The manufacturing method of claim 3, wherein each of the sub light-emitting areas is a non-rectangular sub light-emitting area.

\* \* \* \* \*